United States Patent
Shin et al.

(10) Patent No.: US 6,815,794 B2
(45) Date of Patent: Nov. 9, 2004

(54) SEMICONDUCTOR DEVICES WITH MULTIPLE ISOLATION STRUCTURE AND METHODS FOR FABRICATING THE SAME

(75) Inventors: Hwa-Sook Shin, Suwon-shi (KR); Kwang-Dong Yoo, Sungnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/373,445

(22) Filed: Feb. 25, 2003

(65) Prior Publication Data

US 2003/0168698 A1 Sep. 11, 2003

(30) Foreign Application Priority Data

Mar. 5, 2002 (KR) ........................................ 2002-11621

(51) Int. Cl.[7] .............................................. H01L 29/00
(52) U.S. Cl. ........................ 257/500; 257/329; 257/335; 257/287; 257/343; 257/341; 438/207; 438/355; 438/262; 438/268; 438/258
(58) Field of Search ................................. 257/329, 335, 257/287, 343, 341, 500, 370, 378, 549; 436/207, 355, 262, 268, 258, 201

(56) References Cited

U.S. PATENT DOCUMENTS 5,589,405 A * 12/1996 Contiero et al. ............... 437/6
6,069,034 A * 5/2000 Gregory ...................... 438/201
6,451,655 B1 * 9/2002 Leonardi ..................... 438/268

OTHER PUBLICATIONS

Laura Peters, "Gaining Control over STI Processes," Semiconductor International (Mar., 2000) pp. 1–8.*

* cited by examiner

*Primary Examiner*—Steven Lake
*Assistant Examiner*—Thomas Magee
(74) *Attorney, Agent, or Firm*—F. Chau & Associates LLC

(57) ABSTRACT

Semiconductor devices with a multiple isolation structure and methods for fabricating the same are provided. In one aspect, a semiconductor device comprises a heavily doped buried layer having a first conductivity type, which is formed in a predetermined region of a semiconductor substrate, and an epitaxial layer having the first conductivity type, which covers an entire surface of the semiconductor substrate. A device isolation structure is disposed such that the device isolation structure penetrates the epitaxial layer and a portion of the semiconductor substrate to define a device region. The device isolation structure includes an upper isolation structure penetrating an epitaxial layer as well as a lower isolation structure formed in the semiconductor substrate under the upper isolation structure.

25 Claims, 10 Drawing Sheets

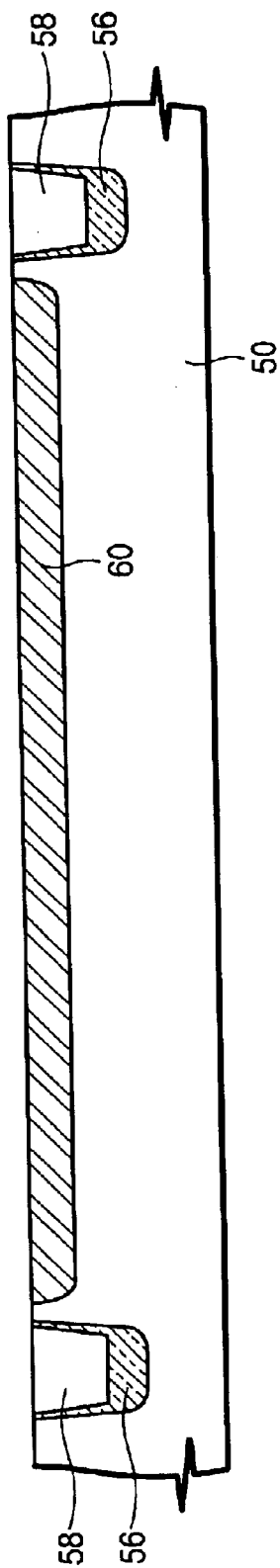
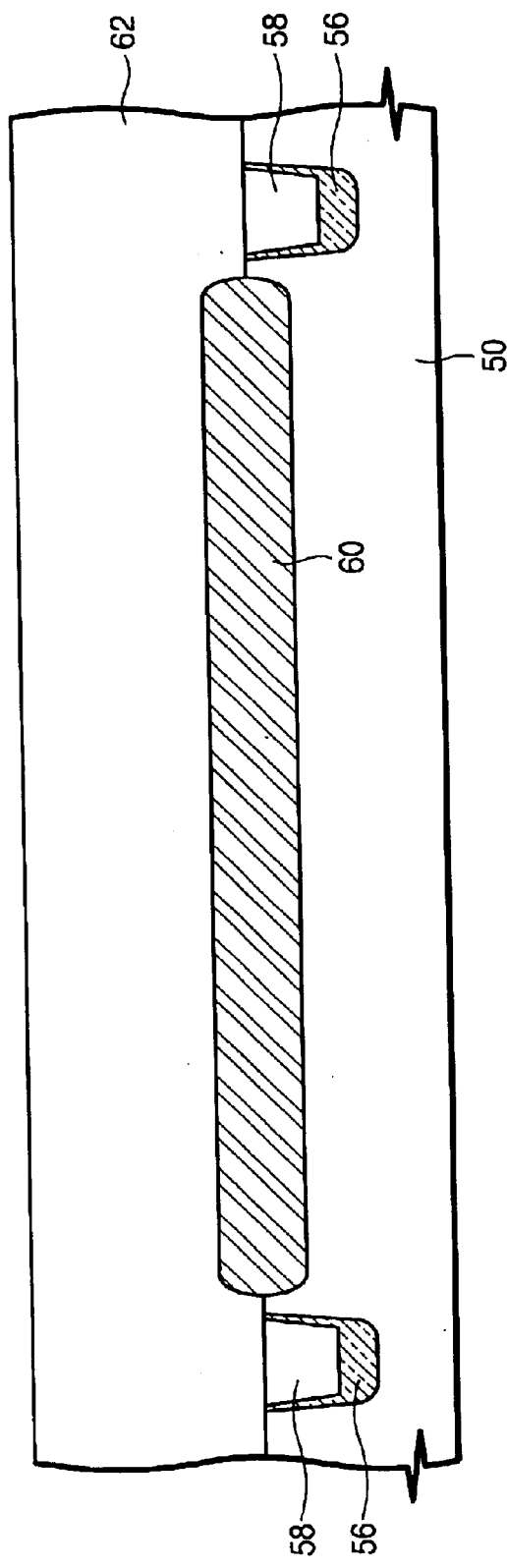

US 6,815,794 B2

SEMICONDUCTOR DEVICES WITH MULTIPLE ISOLATION STRUCTURE AND METHODS FOR FABRICATING THE SAME

CROSS-REFERENCE TO RELATED APPLICATION

This application claims priority to Korean Patent Application No. 2002-11621, filed on Mar. 5, 2002, which is fully incorporated herein by reference.

TECHNICAL FIELD

The present invention relates to semiconductor devices and methods for fabricating the same. More specifically, the present invention relates to semiconductor devices with multiple isolation structure and methods for fabricating the same.

BACKGROUND

Currently, the use of power IC (integrated circuit) products has been expanding to various applications including, e.g., power conversion systems and power control systems and other applications that require large power transmission capacity and high-speed switching. In particular, power IC products are widely used for hard disk drive (HDD), video tape recorder (VTR), and car electronics IC. Double diffused MOS (DMOS) transistors are typically used in power IC products for processing high voltages because such components are highly capable of processing large currents per unit region and have low on-resistance. Since DMOS devices operate at high voltages, device isolation structures with high breakdown voltages are needed between DMOS devices and between a DMOS device and other control circuits. Conventionally, a junction isolation technique using an impurity diffused layer is typically used for device isolation. With this technique, however, a large area is needed for forming a deep device isolation structure. To overcome this problem, various methods for using trench isolation structures have been recently proposed. For example, a method for isolating devices by forming a DMOS device on a silicon on insulator (SOI) substrate is described in U.S. Pat. No. 5,356,822, entitled "Method For Making All Complementary DiCDMOS Devices".

FIG. 1 is a cross-sectional view of a conventional DMOS device having a device isolation structure that is formed using a conventional junction isolation technique. In FIG. 1, a DMOS device comprises a buried layer 6 (having a first conductivity type) which is disposed in a predetermined region of a semiconductor substrate 1, and a buried layer 2 (having a second conductivity type) which is separated from the buried layer 6 by a predetermined space and which surrounds the buried layer 6. An epitaxial layer 8 (having a first conductivity type) is formed on the entire surface of the semiconductor substrate 1 including the buried layers 6 and 2. The epitaxial layer 8 has the same conductivity type of the buried layer but is doped to a lower concentration than the buried layer 6. A junction isolation layer 4 (having a second conductivity type) surrounds a predetermined region of the epitaxial layer 8 and penetrates the epitaxial layer 8 to connect to the buried layer 2. The junction isolation layer 4 and the buried layer 2 form a device isolation structure 5 of the DMOS device. The device isolation structure 5 defines a device region of the DMOS device.

A field oxide layer 16 is disposed on a predetermined region of the device region surrounded by the device isolation structure 5, thereby defining first and second active regions. The field oxide layer 16 is separated from the device isolation structure 5 to surround the first active region. A gate electrode 14 is disposed on the first active region and a gate insulation layer 22 is formed between the first active region and the gate electrode 14.

A source region is disposed in the first active region adjacent to the gate electrode 14, and a drain region is disposed in the second active region. The source region comprises a diffused region 18 of first conductivity type formed in a surface of the first active region adjacent to the gate electrode 14, a diffused region 20 of second conductivity type separated from the gate electrode 14 adjacent to the diffused layer 18 of first conductivity type, and a body region 26 of second conductivity type surrounding the diffused regions 14 and 20 of first and second conductivity types. The drain region comprises a sink region 10 that vertically penetrates the epitaxial layer 8 to connect to the buried layer 6 of first conductivity type, and a heavily doped region 12 formed in a surface of the second active region of an upper portion of the sink region 10.

Conventionally, the breakdown voltage of the DMOS device is proportional to a thickness of the epitaxial layer 8. More particularly, to form the DMOS device with a high breakdown voltage, the epitaxial layer 8 should be formed to a thickness of 10 $\mu$m. Accordingly, when the junction isolation layer 4 is formed to penetrate the thick epitaxial layer 8, a sufficient space is required between the junction isolation layer 4 and the drain region in consideration for diffusion of impurities contained in the junction isolation layer 4 of second conductivity type. As a result, in a DMOS device where the junction isolation technique is applied, an area occupied by the device isolation structure is equivalent to more than 25% of an entire area of the DMOS device.

FIG. 2 is a diagram of a DMOS device having a trench isolation structure, which has been proposed to overcome problems associated with the junction isolation technique. The DMOS device comprises a buried layer 36 (having a first conductivity type) formed in a semiconductor substrate 31, an epitaxial layer 38 that covers an entire surface of the semiconductor substrate 31, a gate electrode 34, a source region and a drain region. The source and drain regions have the same structure as the source and drain regions of the a DMOS device of FIG. 1. In particular, the source region includes a diffused layer 48 of first conductivity type, a diffused layer 30 of second conductivity type, and a body region 44 of second conductivity type. The drain region includes a sink region 40 connected to the buried layer 36 and a heavily doped region 42 formed in an upper portion of the sink region 40.

A device isolation structure 32 is formed to penetrate the epitaxial layer 38 and a portion of the semiconductor substrate 31. The device isolation structure 32 defines a device region. A field oxide layer 46 is disposed on a predetermined region of the device region surrounded by the device isolation structure 32, thereby defining first and second active regions. The gate electrode 34 and the source region are disposed on the first active region surrounded by the field oxide layer 46. The drain region is disposed in the second active region between the field oxide layer 46 and the device isolation structure 32.

As illustrated in FIG. 2, the device isolation structure 32 is preferably formed deeper than the buried layer 36 to isolate adjacent DMOS devices from each other and other control circuits. For example, in a DMOS device with an operating voltage of about 70V, the device isolation structure 32 is preferably formed to have a depth of about 20 μm or more. However, it is difficult to form a deep trench isolation structure in a narrow area using conventional methods due to drawbacks of etching and burying processes.

SUMMARY OF THE INVENTION

The present invention is directed to a semiconductor device that provides a high operating voltage, and a method for fabricating the same. A semiconductor device according to the invention comprises a device isolation structure which exhibits reliable device isolation characteristics and which occupies less area than that of a device region.

According to one aspect of the invention, a semiconductor device having a multiple isolation structure, comprises a heavily doped buried layer of a first conductivity type and an epitaxial layer covering an entire surface of the semiconductor substrate including the buried layer. A device isolation structure penetrates the epitaxial layer and a portion of the semiconductor substrate to define a device region. A field oxide layer is disposed on the device region, thereby defining first and second active regions. A gate electrode and a source region are disposed at the first active region, and a drain region is disposed in the second active region. The buried layer is disposed between the semiconductor substrate and the epitaxial layer in the device region.

In another aspect of the invention, the device isolation structure comprises an upper isolation structure penetrating the epitaxial layer and a lower isolation structure formed in the semiconductor substrate.

In yet another aspect of the invention, the source region includes a diffused layer having a first conductivity type and a body region having a second conductivity type. The drain region may include a sink region having the first conductivity type and a heavily doped region of the first conductivity type. The diffused region having the first conductivity type may be formed in the first active region adjacent to the gate electrode. The body region having the first conductivity type preferably surrounds the diffused region having the first conductivity type and has an overlapped portion with the gate electrode under the gate electrode. The sink region may be connected to the buried layer, and the heavily doped region may be formed in a top surface of the sink region.

In another aspect of the present invention, a method for fabricating a semiconductor device with multiple isolation structure, comprises forming a lower isolation structure in a predetermined region of a semiconductor substrate to define a device region and forming a buried layer having a first conductivity type in the device region, forming an epitaxial layer having the first conductivity type on an entire surface of the semiconductor substrate having the buried layer and the lower isolation structure, and forming an upper isolation structure in the epitaxial layer such that the upper isolation structure penetrates the epitaxial layer to define the device region. The upper isolation structure is preferably connected to an upper portion of the lower isolation structure. The method further comprises forming a field oxide layer in the device region, thereby defining first and second active regions, forming a gate electrode on the first active region, and forming source and drain regions in the first and second active regions, respectively.

The lower and upper isolation structures may be formed using a shallow trench isolation technique. The field oxide layer may be formed using a LOCOS technique. The source region may include a body region having a second conductivity type formed in the first active region adjacent to the gate electrode, an impurity diffused region of a first conductivity type formed in a surface of the body region adjacent to the gate electrode, and a diffused layer of the second conductivity type separated from the gate electrode and formed in the vicinity of the diffused layer of first conductivity type. The drain region may include a sink region having a first conductivity type and a heavily doped layer having a first conductivity type. Formation of the sink region of the first conductivity type may include doping impurities into the second active region prior to the step of forming the field oxide layer to be connected to the buried layer. The heavily doped layer of the first conductivity type may be formed by doping impurities into a surface of the second active region after forming the field oxide layer.

These and other aspects, features, and advantages of the present invention will become apparent from the following detailed description of the preferred embodiments, which is to be read in connection with the accompanying drawings.

BRIEF DESCRIPTION OF THE DRAWINGS

FIGS. 4 through 12 are cross-sectional views for illustrating a method for fabricating the semiconductor device according to a preferred embodiment of the present invention.

DETAILED DESCRIPTION OF PREFERRED EMBODIMENTS

Figure 1:
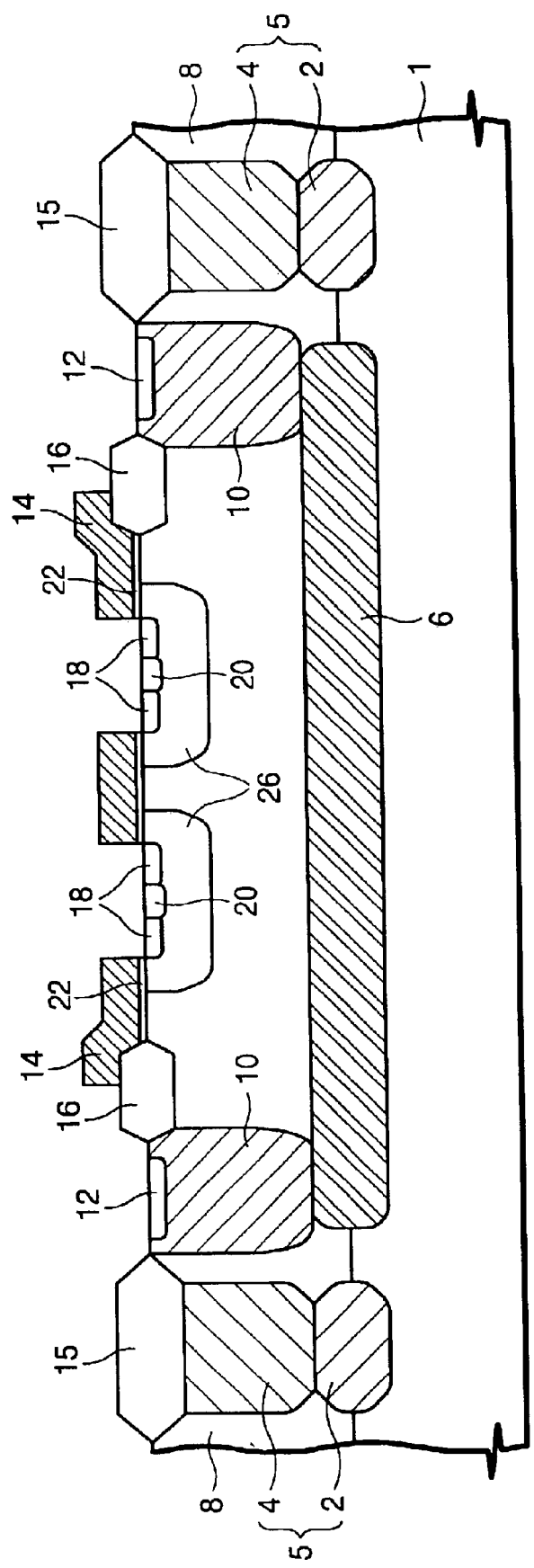
FIG. 1 is a cross-sectional view of a DMOS device having a device isolation structure that is formed using a conventional junction isolation technique.
Figure 2:
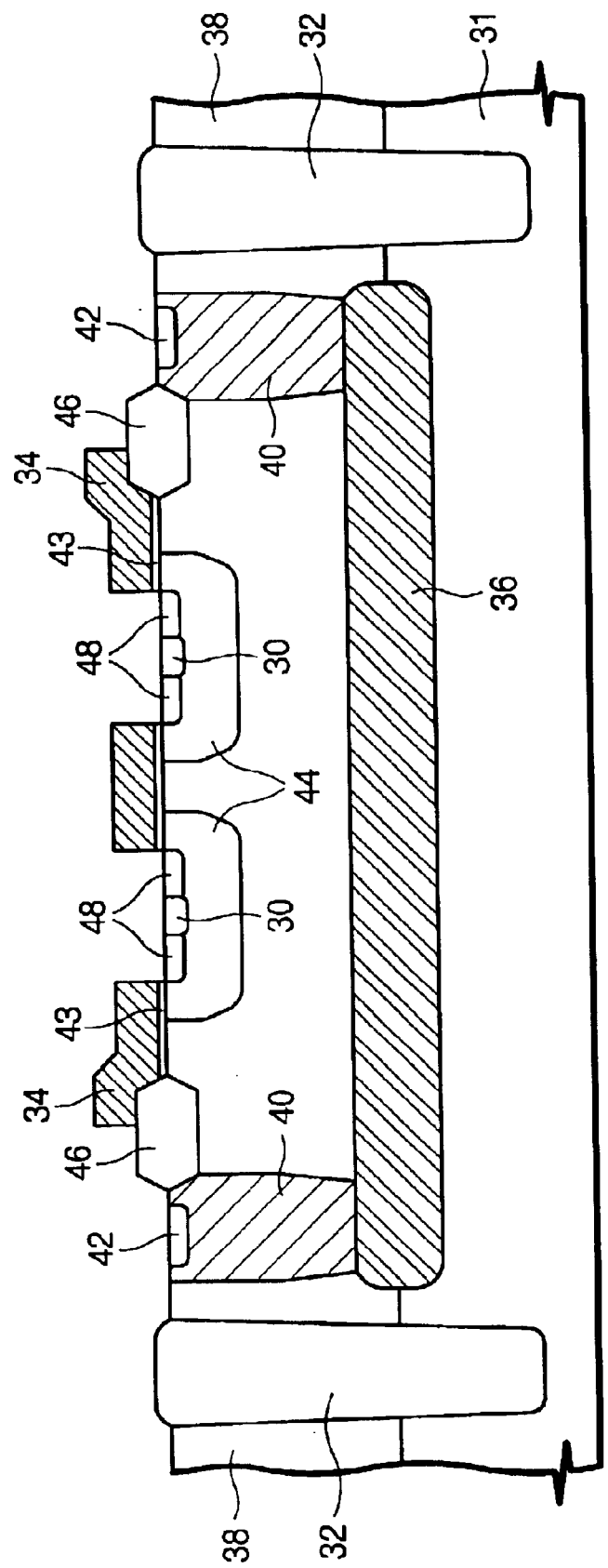
FIG. 2 is a diagram of a DMOS device having a conventional trench isolation structure.

The present invention will now be described more fully hereinafter with reference to the accompanying drawings, in which preferred embodiments of the invention are shown. The invention may, however, be embodied in different forms and nothing herein should be construed as placing any limitation on the exemplary embodiments herein. The embodiments described herein are provided so that this disclosure will be thorough and complete, and will fully convey the scope of the invention to those skilled in the art. In the drawings, the thickness of layers and regions are exaggerated for clarity. It should further be understood that when a layer is referred to as being "on" another layer or substrate, it can be directly on the other layer or substrate, or intervening layers may also be present. In addition, the same reference numbers denote the same or similar elements throughout the drawings.

Figure 3:
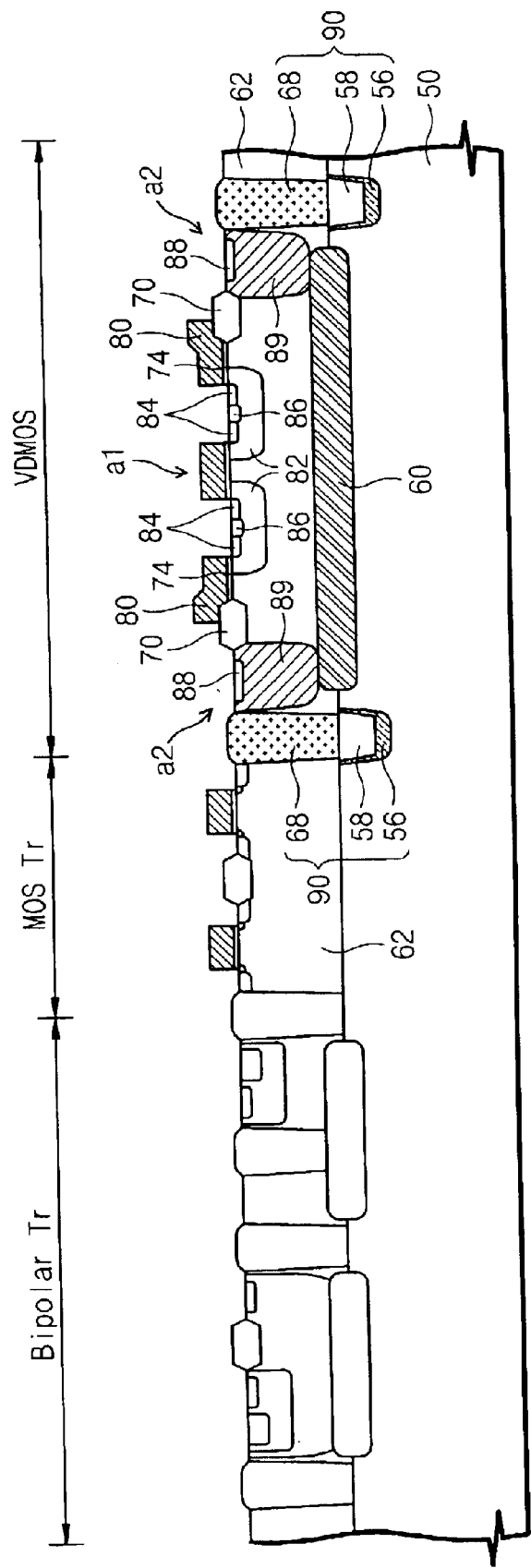
FIG. 3 is a schematic cross-sectional view of a portion of a power IC having a semiconductor device according to a preferred embodiment of the present invention.

FIG. 3 is a schematic cross-sectional view of a portion of a power IC having a semiconductor device according to a preferred embodiment of the present invention. In FIG. 3, a power IC is made of various devices so as to operate at a high voltage and high current. More specifically, he power IC includes a MOS transistor (MOS Tr), a bipolar transistor (Bipolar Tr), a semiconductor device (DMOS), and the like. The DMOS device is preferably a vertical semiconductor device VDMOS, which exhibits reliable characteristics in a chip of narrow area. Each device is separated from adjacent devices by a device isolation structure having a high breakdown voltage.

The semiconductor device DMOS includes a buried layer 60 (having a first conductivity type) that is formed in a predetermined region of a semiconductor substrate 50. An epitaxial layer 62 (having a first conductivity type) covers an entire surface of the semiconductor substrate 50 including the buried layer 60. The buried layer 60 is an impurity diffused layer formed in the semiconductor substrate 50 including the epitaxial layer 62 to a predetermined thickness. The buried layer 60 is doped to a higher concentration than the epitaxial layer 62. A device isolation structure 90 penetrates a portion of the semiconductor substrate and the epitaxial layer 62 to define a device region of the DMOS device. The device isolation structure 90 includes a lower isolation structure 58 formed in the semiconductor substrate 50 to surround the buried layer 60 and an upper isolation structure 68 formed in the epitaxial layer 62 to surround the device region. The lower and upper isolation structures 58 and 68 are formed using known trench isolation techniques. The lower isolation structure 58 is formed deeper than the buried layer 60, thereby preventing a punchthrough or a breakdown phenomenon between an adjacent high voltage device and the buried layer 60. Generally, the buried layer 60 is formed in the semiconductor substrate 50 to a depth of 2 to 3 $\mu$m. Thus, the lower isolation structure 58 is preferably formed in the semiconductor substrate 50 to a depth of 5 $\mu$m or more. The device isolation structure 90 may further comprise a junction isolation layer 56 by doping impurities of second conductivity type into the semiconductor substrate 50 under the lower isolation structure 58, in order to improve device isolation ability.

A field oxide layer 70 is disposed on a predetermined region of the device region defined by the device isolation structure 90, thereby defining first and second active regions a1 and a2. The first active region a1 is a region surrounded by the field oxide layer 70, and the second active region a2 is a region between the field oxide layer 70 and the device isolation structure 90. The field oxide layer 70 may be formed using a LOCOS technique.

A gate electrode 80 is disposed on the first active region a1. A gate insulation layer 74 is disposed between the gate electrode 80 and the first active region a1. A portion of the gate electrode 80 overlaps the field oxide layer 70. Generally, in a DMOS device, the gate electrode is formed into a mesh-shaped structure. Accordingly, the gate electrode 80 has a plurality of openings exposing the first active region a1. A source region is disposed in the first active region a1 exposed by the opening, and a drain region is disposed in the second active region a2. The source region includes a diffused layer 84 of first conductivity type formed in the first active region a1 adjacent to the gate electrode 80, and a body region 82 of second conductivity type surrounding the diffused layer 84 of first conductivity type and having an overlapped region with the gate electrode 80 under the gate electrode 80. The source region may further include a diffused layer 86 of second conductivity type, which is adjacent to the diffused layer 84 of first conductivity type and separated from the gate electrode 80. The drain region includes a sink region 89 of first conductivity type formed in the second active region a2 to be vertically connected to the buried layer 60, and a heavily doped region 88 formed in a surface of the second active region in the sink region 89. Although not shown in the drawings, the drain and source regions are connected to drain and source electrodes, respectively. That is, the source electrode is connected in common to the diffused layer 84 of first conductivity type and the diffused layer 86 of second conductivity type, thereby turning off a parasitic bipolar transistor during operation of the DMOS.

Advantageously, a semiconductor device according to an embodiment of the invention, such as illustrated in FIG. 3, comprises a double device isolation structure, which comprises a lower isolation structure separated from the semiconductor substrate including the buried layer as well as an upper isolation structure connected to an upper portion of the lower isolation structure to surround the device region. Accordingly, a semiconductor device according to an embodiment of the invention may have a deep device isolation structure of 15 $\mu$m or more in a limited area.

Figure 4:
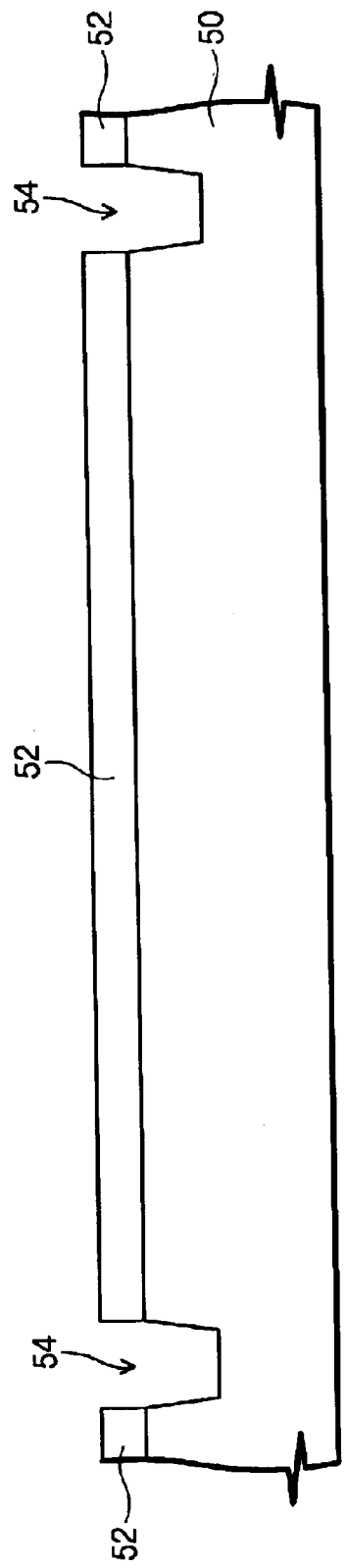
Figure 5:
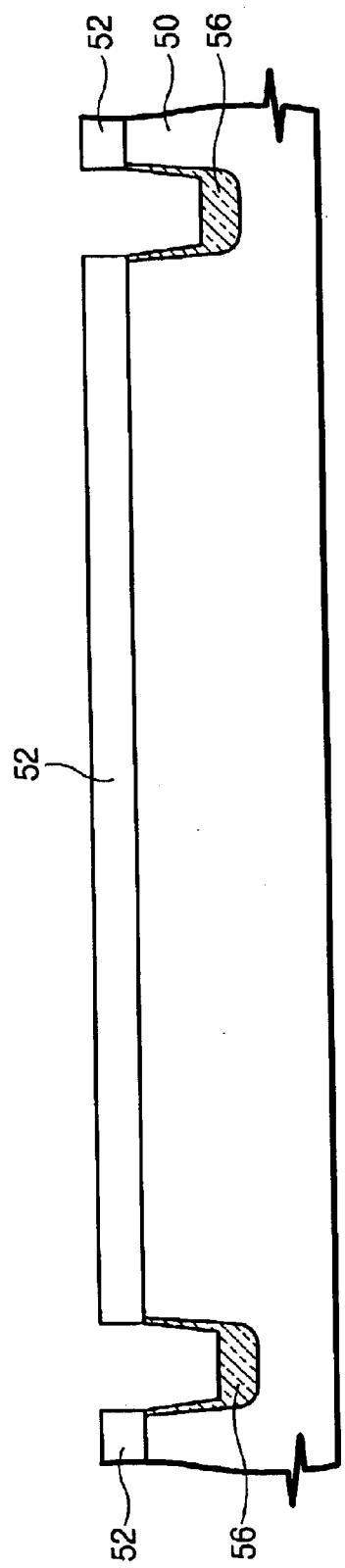

FIGS. 4 through 12 are cross-sectional views for illustrating a method for fabricating a semiconductor device according to an embodiment of the present invention. Referring initially to FIGS. 4 and 5, a first hard mask pattern 52 is formed on a semiconductor substrate 50 to expose a predetermined region of the semiconductor substrate 50. The semiconductor substrate 50 preferably comprises a p-type silicon substrate. The semiconductor substrate 50 is etched by using the first hard mask pattern 52 as an etch mask to form a first trench region 54. The first trench region 54 may be formed to a depth of approximately 5 to 10 $\mu$m. P-type impurities are doped into the bottom of the first trench region 54 by using the first hard mask pattern 52 as an ion implantation mask. As a result, as shown in FIG. 5, a junction isolation layer 56 is formed in the bottom of the first trench region 54. The junction isolation layer 56 may be formed by injecting B, $BF_2$, or In, for example.

Referring to FIG. 6, a lower isolation structure 58 is formed in the semiconductor substrate 50 to fill an inside of the first trench region 54. The first hard mask pattern 52 is then removed. The lower isolation structure 58 may be formed using a shallow trench isolation technique. An n-type buried layer 60 is formed by doping impurities into the semiconductor substrate 50 surrounded by the lower isolation structure 58. The n-type buried layer 60 may be formed by injecting P, As, or Sb, for example, at a dose of about $1\times10^{13}$ to $1\times10^{14}$ ions/cm$^2$. In case that the junction isolation layer 56 is formed, the n-type buried layer 60 may be formed such that the n-type buried layer 60 is separated from the junction isolation layer 56 by a predetermined space, in consideration of external diffusion.

Referring to FIG. 7, an n-type epitaxial layer 62 is grown over the entire surface of the semiconductor substrate 50 including the buried layer 60. The n-type epitaxial layer 62 is formed having a lower concentration of dopants than the concentration of dopants of the buried layer 60. The epitaxial layer 62 may be formed to a thickness of approximately 10 $\mu$m in order to increase the breakdown voltage of the semiconductor device. While the epitaxial layer 62 is grown, the buried layer 60 is diffused into the semiconductor substrate 50 and the epitaxial layer 62. The resulting n-type buried layer 60 has a thickness of approximately 3 to 10 $\mu$m.

Figure 8:
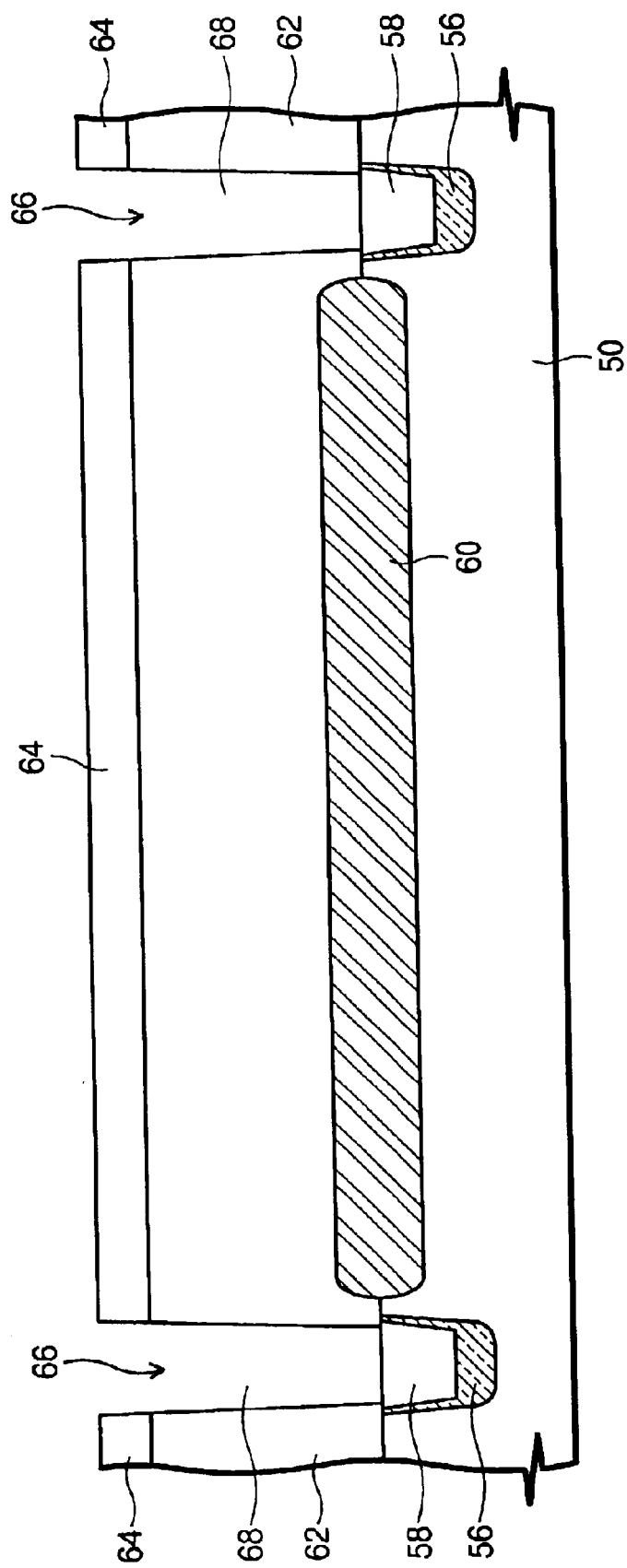
Figure 9:
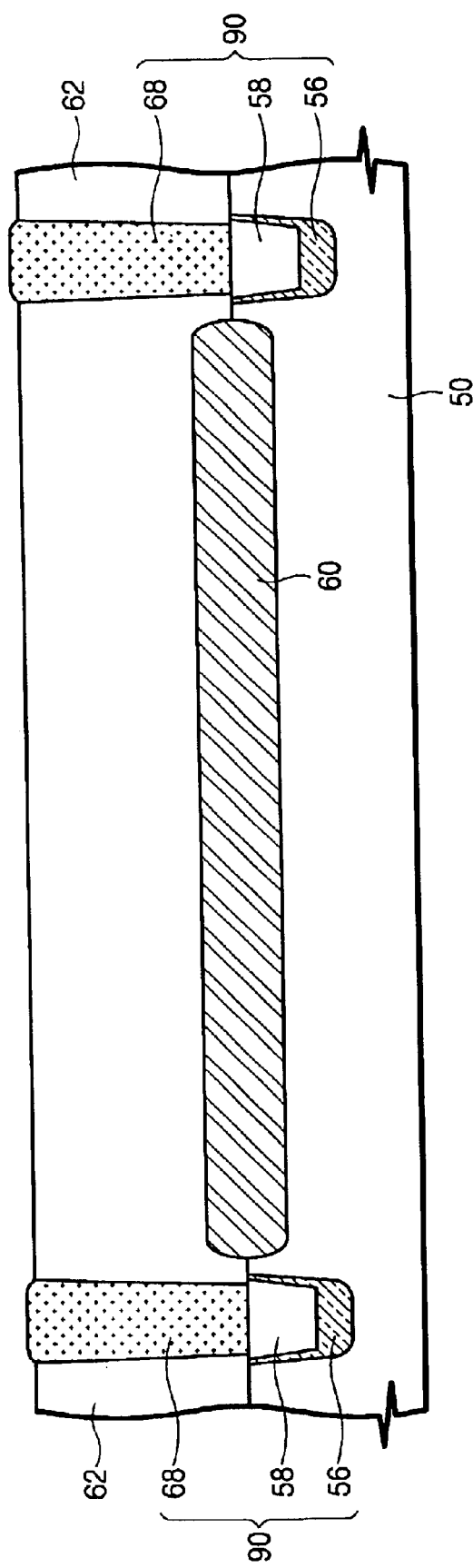

Referring to FIGS. 8 and 9, a second hard mask pattern 64 is formed on the epitaxial layer 62 to expose a predetermined region of the epitaxial layer 62. In particular, a surface of the epitaxial layer 62 over the lower isolation structure 58 is exposed. The epitaxial layer 62 is etched by using the second hard mask pattern 64 as an etch mask, thereby forming a second trench region 66 to expose the lower isolation structure 58. An upper isolation structure 68 is formed to fill the second trench region 66 and the second hard mask pattern 64 is removed. The upper isolation structure 68 may be formed using known trench isolation techniques. The lower and upper isolation structures 58 and 68 constitute a device isolation structure 90. In the event that a junction isolation layer 56 is formed under the lower isolation structure 58, the device isolation structure 90 may include the junction isolation layer 56, the lower isolation structure 58, and the upper isolation structure 68. The device isolation structure 90 has a loop structure of sequentially penetrating the epitaxial layer 62 and the semiconductor substrate 50 and surrounding a predetermined region. The semiconductor substrate 50 and the epitaxial layer 62 surrounded by the device isolation structure 90 correspond to the device region where the semiconductor device will be formed.

Figure 10:
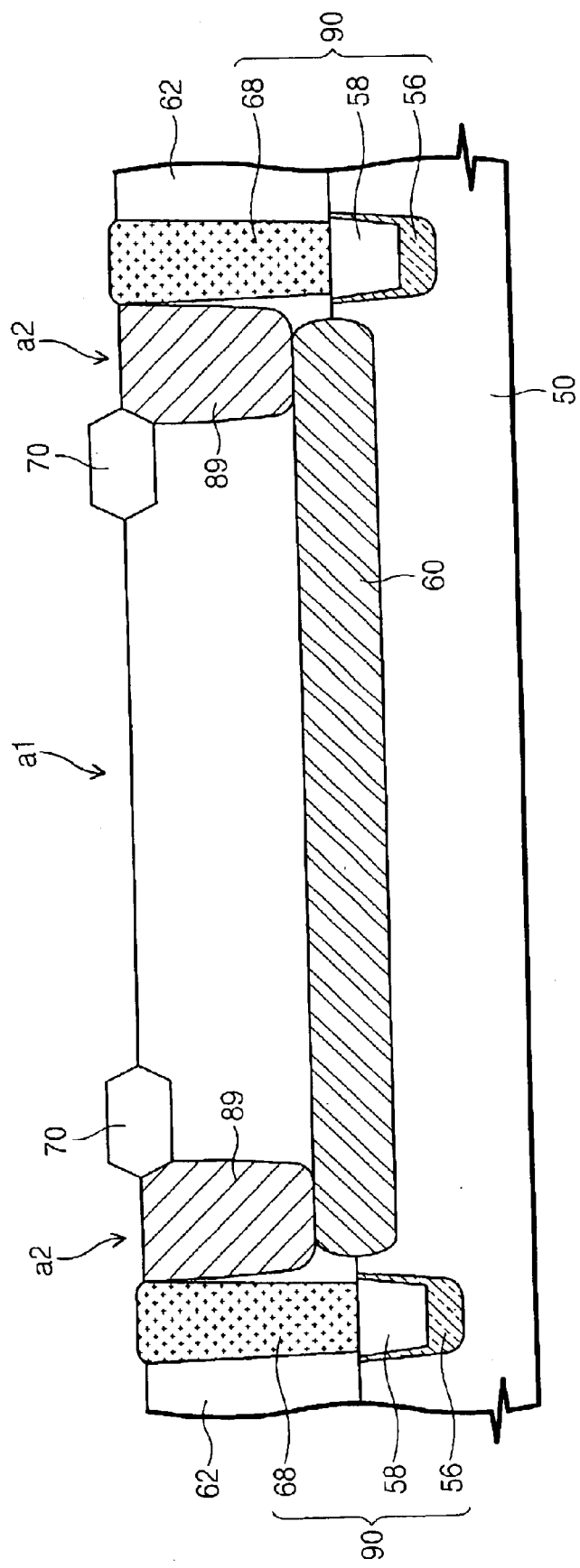

Referring to FIG. 10, impurities are doped into the epitaxial layer 62 adjacent to an inner wall of the device isolation structure 90, thereby forming a sink region 89 that is vertically connected to the buried layer 60. The sink region 89 may be formed by injecting P, As, or Sb, for example, at a dose of about $1 \times 10^{13}$ to $1 \times 10^{14}$ ions/cm$^2$. That is, the sink region 89 is formed to have a higher concentration than the epitaxial layer 62. Thereafter, a field oxide layer 70 is formed in the device region to define first and second active regions a1 and a2. The field oxide layer 70 is formed in the vicinity of the sink region 89, thereby separating the first active region a1 surrounded by the field oxide layer 70 as well as the second active region a2 where the sink region 89 is formed. The field oxide layer 70 may be formed using a LOCOS technique. While the field oxide layer 70 is formed, the impurities of the sink region 89 may be activated to lower a resistance of the sink region 89.

Figure 11:
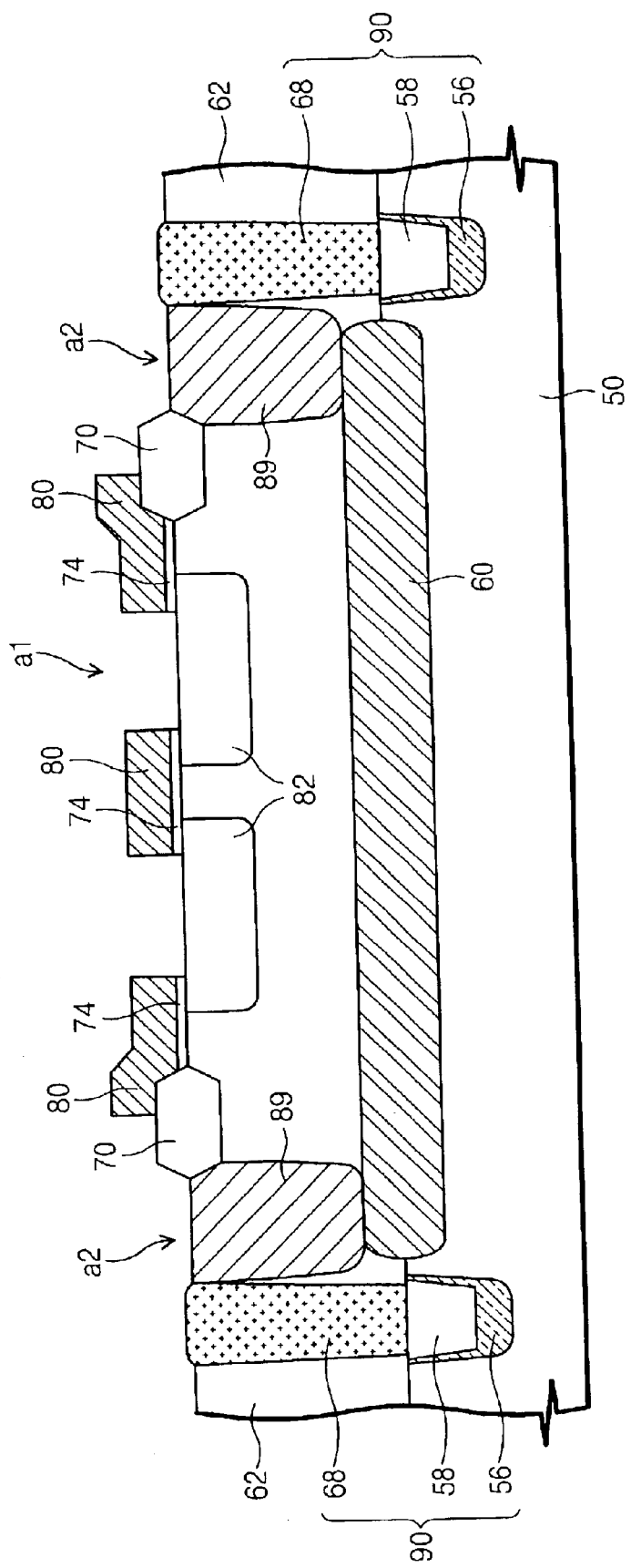

Referring to FIG. 11, a gate electrode 80 is formed on the first active region a1. A gate insulation layer 74 is disposed between the gate electrode 80 and the first active region a1, and a portion of the gate electrode 80 overlaps the field oxide layer 70. A process of forming the gate electrode 80 may comprise, for example, forming an insulation layer and a gate conductive layer, which sequentially cover the first active region a1, then patterning the gate conductive layer. The gate electrode 80 may be typically formed into a mesh-shaped structure with a plurality of openings exposing the first active region a1. Continuously, a p-type body region 82 is formed in the first active region a1 by using a photoresist pattern (not shown) and the gate electrode 80 as an ion implantation mask. Next, a thermal process is applied to the semiconductor substrate 50 such that the p-type body region 82 is diffused to overlap with the gate electrode 80 under the gate electrode 80. At this time, the impurities of the sink region 89 are also diffused and activated to lower the resistance of the sink region 89 all the more.

Figure 12:
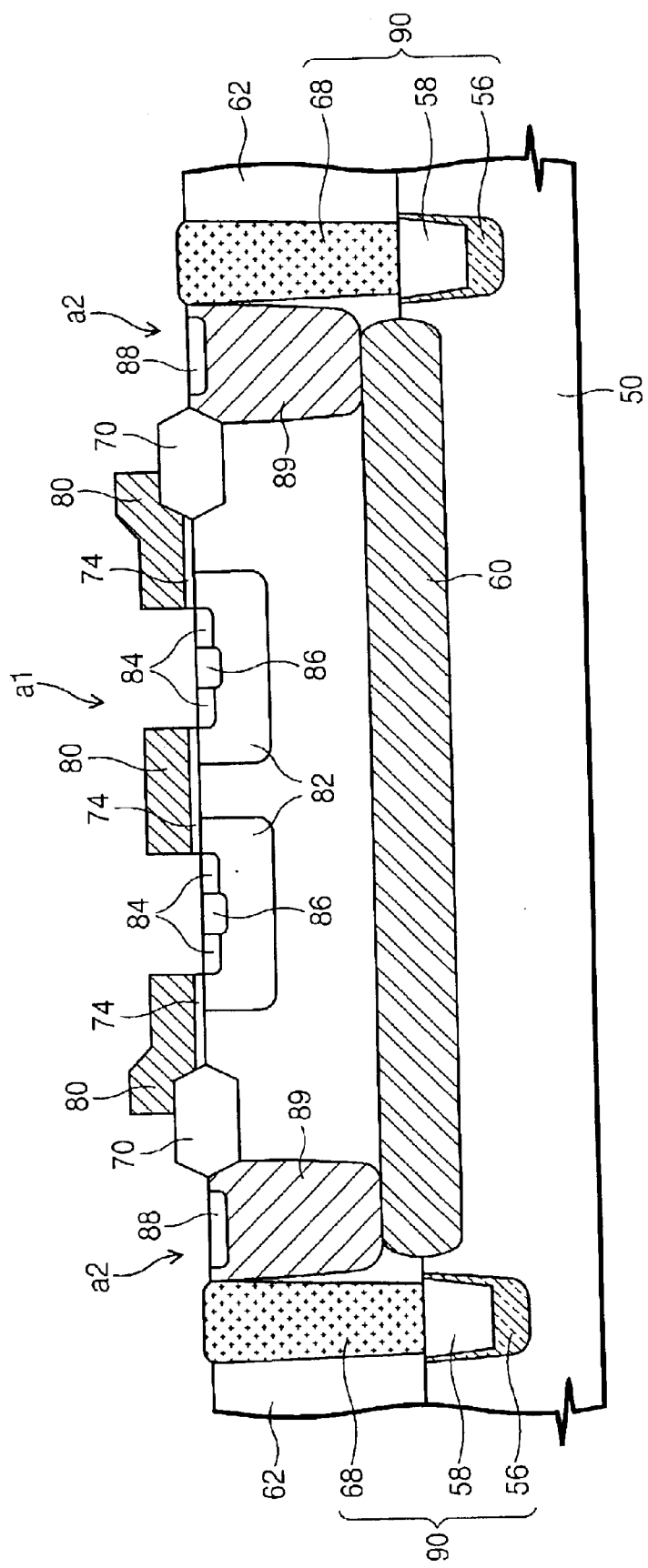

Referring to FIG. 12, by using a photolithographic process and an ion implantation process, an n-type diffused layer 84 is formed in the first active region a1 adjacent to the gate electrode 80 and, at the same time, an n-type heavily doped region 88 is formed in a surface of the second active region a2 of an upper portion of the sink region 89. The n-type heavily doped region 88 is formed to a higher concentration than the sink region 89. In addition, a p-type diffused layer 86 is formed in the first active region a1, which is adjacent to the n-type diffused layer 84 and separated from the gate electrode 80. This results in formation of a source region including the n-type diffused layer 84, the p-type diffused layer 86, and the p-type body region 82, which surrounds the n-type and p-type diffused layers 84 and 86 and overlaps with the gate electrode 80 under the gate electrode 80. Also, a drain region, which includes the sink region 89 and the heavily doped region 88, is formed in the second active region a2. Although not shown in the drawings, by use of a conventional interconnection process, a source electrode, a drain electrode, and a gate electrode are formed to be connected to the source region, the drain region, and the gate electrode, respectively.

In summary, in accordance with the invention, a device isolation structure with a reliable device isolation characteristic may be formed in an area limited by a double device isolation structure. In other words, the invention solves the problem of an increase in device isolation regions due to an external diffusion as in conventional semiconductor devices having a conventional junction isolation structure. In addition, a deep trench isolation structure of 15 µm or more may be formed in a semiconductor device according to the invention with a single device isolation structure. Consequently, it becomes possible to remarkably improve device isolation ability of a semiconductor device operating at high voltage and high current.

Although illustrative embodiments have been described herein with reference to the accompanying drawings, it is to be understood that the present invention is not limited to those precise embodiments, and that various other changes and modifications may be affected therein by one skilled in the art without departing from the scope and spirit of the invention. It is to be understood that all such changes and modifications are intended to be included within the scope of the invention as defined by the appended claims.

What is claimed is:

1. A semiconductor device comprising:
   a doped buried layer having a first conductivity type, formed in a semiconductor substrate;
   an epitaxial layer having the first conductivity type, covering an entire surface of the semiconductor substrate;
   a device isolation structure, which penetrates the epitaxial layer and a portion of the semiconductor substrate, to define a device region;
   a field oxide layer disposed on the device region to define first and second active regions;
   a gate electrode disposed on the first active region; and
   source and drain regions formed in the first and second active regions, respectively,
   wherein the buried layer is positioned in the device region, and wherein the device isolation structure comprises an upper isolation structure that penetrates the epitaxial layer, and a lower isolation structure that is formed entirely in the semiconductor substrate below the upper isolation structure.

2. The device as claimed in claim 1, wherein the epitaxial layer is doped to have a lower concentration than a dopant concentration of the buried layer.

3. The device as claimed in claim 1, wherein the device isolation structure further comprises a junction isolation layer formed in the semiconductor substrate under the lower isolation structure and contacting the lower isolation structure.

4. The device as claimed in claim 1, wherein the lower isolation structure is formed in the semiconductor substrate at a depth that is greater than the depth of the doped buried layer.

5. The device as claimed in claim 1, wherein the device isolation structure surrounds the buried layer and is separated from the buried layer.

6. The device as claimed in claim 1, wherein the field oxide layer is separated from the device isolation structure to surround the first active region.

7. The device as claimed in claim 6, wherein the second active region is disposed between the field oxide layer and the device isolation structure.

8. The device as claimed in claim 1, wherein a portion of the gate electrode overlaps an upper portion of the field oxide layer.

9. The device as claimed in claim 1, wherein the drain region is doped with impurities of first conductivity type at a higher concentration than the epitaxial layer.

10. The device as claimed in claim 1, wherein the drain region comprises:
   a sink region connected to the buried layer; and
   a heavily doped region formed in an upper surface of the sink region.

11. The device as claimed in claim 10, wherein the sink region and the heavily doped region are doped with impurities of the first conductivity type at a higher concentration than the epitaxial layer, and the heavily doped region is doped at a higher concentration than the sink region.

12. The device as claimed in claim 1, wherein the source region comprises:
   a diffused layer having the first conductivity type, which is adjacent to the gate electrode; and
   a body region surrounding the diffused layer and having portion that overlaps the gate electrode under the gate electrode.

13. The device as claimed in claim 1, wherein the source region comprises:
   a diffused layer having a second conductivity type, which is separated from the gate electrode and formed in a surface of the first active region;
   a diffused layer having the first conductivity type, which is formed in a surface of the first active region between the gate electrode and the diffused layer having the second conductivity type; and
   a body region having a second conductivity type, which surrounds the diffused layers of first and second conductivity types,
   wherein a depth of the body region of second conductivity type is greater than the depth of the diffused layers of first and second conductivity types, and wherein a portion of the body region overlaps the gate electrode under the gate electrode.

14. The device as claimed in claim 13, wherein the dopant concentration of the diffused layer having the second conductivity type is greater than the dopant concentration of the body region.

15. A method of fabricating a semiconductor device comprising:
   forming a lower isolation structure entirely in a semiconductor substrate to define a device region;
   forming a buried layer having a first conductivity type in the device region;
   forming an epitaxial layer having the first conductivity type on an entire surface of the semiconductor substrate having the buried layer and the lower isolation structure;
   forming an upper isolation structure in the epitaxial layer to define the device region, wherein the upper isolation structure is connected to an upper portion of the lower isolation structure;
   forming a field oxide layer in the device region to define first and second active regions;
   forming a gate electrode on the first active region; and
   forming source and drain regions in the first and second active regions, respectively.

16. The method as claimed in claim 15, wherein the step of forming the lower isolation structure comprises:
   forming a first hard mask pattern on the semiconductor substrate;
   patterning the semiconductor substrate using the first hard mask pattern as an etch mask to form a first trench;
   filling an insulation layer in the first trench; and
   removing the first hard mask pattern.

17. The method as claimed in claim 16, further comprising the step of forming a junction isolation layer having a second conductivity type by doping impurities into a bottom of the first trench by using the first hard mask pattern as an ion implantation mask, prior to filling the insulation layer.

18. The method as claimed in claim 17, wherein the junction isolation layer is formed by injecting B, $BF_2$, or In.

19. The method as claimed in claim 15, further comprising the step of applying a thermal process to the semiconductor substrate, after forming the buried layer having the first conductivity type.

20. The method as claimed in claim 15, wherein the step of forming the upper isolation structure comprises:
   forming a second hard mask pattern on the epitaxial layer to expose the epitaxial layer of an upper portion of the lower isolation structure;
   etching the epitaxial layer using the second hard mask pattern as an etch mask to form a second trench exposing the lower isolation structure;
   filling an insulation layer in the second trench; and
   removing the second hard mask pattern.

21. The method as claimed in claim 15, wherein the field oxide layer comprises a thermal oxide layer.

22. The method as claimed in claim 15 wherein the field oxide layer is separated from the upper isolation structure to surround the first active region, and defines the second active region between the field oxide layer and the upper isolation structure.

23. The method as claimed in claim 15, wherein a portion of the gate electrode overlaps the field oxide layer.

24. The method as claimed in claim 15, wherein the step of forming the source region comprises:
   forming a body region having a second conductivity type in the first active region adjacent to the gate electrode;
   forming a diffused layer having the first conductivity type in a surface of the body region adjacent to the gate electrode; and
   forming a diffused layer having the second conductivity type in a surface of the body region, which is separated from the gate electrode and adjacent to the diffused layer of first conductivity type.

25. The method as claimed in claim 15, wherein the step of forming the drain region comprises:
   doping impurities into the second active region before forming the field oxide layer to form a sink region having the first conductivity type connected to the buried layer; and
   doping impurities into a surface of the second active region after forming the field oxide layer to form a heavily doped layer of first conductivity type.

* * * * *